United States Patent [19]

Draus et al.

[11] Patent Number: 5,650,717
[45] Date of Patent: Jul. 22, 1997

[54] PORTABLE APPARATUS FOR TESTING AN ELECTRIC UTILITY METER

[76] Inventors: Thomas A. Draus; Rosalie V. Draus, both of 2 Tabor Rd., Enfield, Conn. 06082

[21] Appl. No.: 8,147

[22] Filed: Jan. 25, 1993

[51] Int. Cl.$^6$ ................................................. G01R 35/04
[52] U.S. Cl. ........................................ 324/74; 364/571.01
[58] Field of Search ....................... 324/142, 74, 158 R, 324/130, 103 R, 73.1, 158.1; 364/571.01; 340/657, 660

[56] References Cited

U.S. PATENT DOCUMENTS

| | | | |
|---|---|---|---|
| 1,237,379 | 8/1917 | Platt | 324/74 |
| 2,586,008 | 2/1952 | Davis, III | 324/74 |
| 2,938,165 | 5/1960 | Greig | 324/74 |
| 2,957,133 | 10/1960 | Burkhart, Jr. et al. | 324/74 |
| 4,646,003 | 2/1987 | Phillips et al. | 324/74 |
| 4,837,504 | 6/1989 | Baer et al. | 324/142 |
| 4,999,569 | 3/1991 | Weikel | 324/130 |

*Primary Examiner*—Vinh P. Nguyen

[57] ABSTRACT

Disclosed is an apparatus for testing a meter in a vehicle or any other location where utility power is not available. The apparatus generally includes a stationary fixture and an instrumentation unit. The stationary fixture includes a meter box and power source configured to provide an a.c voltage at the meter box. The stationary fixture further includes a leveling mechanism for mounting and leveling the meter box. The stationary fixture may be used in conjunction with the with the instrumentation unit to test a meter within a vehicle or alternatively, may be removed from the stationary fixture and used to test a meter directly at the customer's meter box.

20 Claims, 6 Drawing Sheets

5,650,717

PORTABLE APPARATUS FOR TESTING AN ELECTRIC UTILITY METER

FIELD OF THE INVENTION

The present invention generally relates to test apparatus and more particularly, to an apparatus for testing metering equipment.

BACKGROUND OF THE INVENTION

Metering equipment is the primary means by which an electric utility company periodically measures the amount of electrical energy or power used by each of its customers. One type of metering equipment that is commonly used for domestic or home metering is the "watt-hour meter." The watt-hour meter is essentially an electric motor that runs in proportion to the power being used by the customer and which records the energy used by the customer over the billing period. For larger customers, the utility company charges for low power factors and the metering equipment may also include a reactoformer along with the watt-hour meter to record the reactive volt-ampere-hours during a billing period. Similarly, the utility company will generally charge for "demand" and the metering equipment may include a reactive demand meter which records reactive demand.

In that currently available metering equipment generally employ electro-mechanical measuring devices, they must be periodically tested to ensure that they are accurately measuring the energy consumed by the customer. Presently, some utility companies perform a simple field test on the meters to determine whether they are working properly. If the meter is not working correctly, the technician will bring the defective meter to a central testing location where the meter will be recalibrated for later use. In view of the large number of meters in service, however, a growing number of utility companies prefer to test and if necessary, recalibrate the meter directly in the field. This combined field testing and on-site recalibration process saves a great deal of time and money.

U.S. Pat. No. 4,646,003 discloses an apparatus for testing a watt-hour meter at the operational site of the customer. Apparatus of this type generally apply a phantom load to the meter and to a watt transducer. The watt-hour reading of the meter is compared to an ideal watt-hour figure computed by the watt transducer based upon the actual test currents, and the result of that comparison is represented as a percentage error. The watt-hour readings of such meters are commonly determined by a light sensing device which senses each rotation of the disc within the meter and then outputs a signal indicative of the number of rotations to the watt transducer.

Apparatus of this type, however, have several disadvantages. In particular, such apparatus require the technician to test the meter at the customer's meter box which is normally located outdoors. Because such test apparatus employ a light sensor to count the disc rotations, rainy or snowy weather conditions may make such measurements difficult and inaccurate. Furthermore, cold and unpleasant weather conditions may create such an uncomfortable working environment that the technician may be inclined to rush the testing process whereby the accuracy may be adversely affected. Additionally, such apparatus are heavy and cumbersome to carry to the customer's meter box which sometimes may be located quite a distance from the street and/or positioned in awkward places.

SUMMARY OF THE INVENTION

One object of the present invention is to provide an apparatus that technicians can use in their vehicle to test the metering equipment, thereby allowing the technician to perform the testing and recalibration process in a more comfortable and controlled environment.

Another object of the present invention is to provide an apparatus which also gives the technician the option of testing the meter in their vehicle or at the customer's meter box.

The above objects are achieved by the test apparatus of the present invention that generally comprises a combination of a stationary fixture and a removable instrumentation unit. The stationary fixture may be mounted in a vehicle such as a van. The instrumentation unit includes all of the necessary components to test the meter on the stationary fixture or alternatively, at the customer's meter box.

The stationary fixture generally comprises a meter box similar in construction to a customer's meter box and a power supply adapted to provide a voltage at the meter box. The power supply generally includes a 12 volt d.c. battery, a generator, and transformer which are configured to generate a voltage of 120 or 240 a.c. The stationary fixture further comprises means for dampening the vibration produced by the operation of the generator. In the preferred embodiment, the dampening means includes a plurality of spring members configured to isolate the generator from the meter box. The stationary fixture may also comprise a mechanism for leveling the meter box should it become unlevel due to the orientation of the vehicle.

BRIEF DESCRIPTION OF THE DRAWINGS

The following detailed description of the invention will be better understood with reference to the accompanying drawings in which.

DETAILED DESCRIPTION OF THE PREFERRED EMBODIMENTS

The present invention is an apparatus for testing utility meters such as those commonly found at homes, offices or commercial buildings. Such utility meters typically take the form of a watt-hour meter having two or more line coils and/or potential coils. The following detailed description is made with reference to a standard four blade terminal 240 volt, 7.2 watt-hour meter (not shown) having a line coil A, a line coil B, and a potential coil. Each of these components contribute to the rotation of the meter disc and as such, must be tested (individually, and/or in combination) to ensure that the meter is accurately measuring the energy consumed by the customer. It will become apparent to those skilled in that art, however, that the present invention can be readily used and/or modified for the testing of other metering equipment. By way of example only, such metering equipment may include a watt-hour meter having more than four blade terminals and/or a metering device employing a watt-hour meter in combination with a power factor measuring device and/or a demand meter.

As will be described herein, the apparatus of the present invention may used in a vehicle such as a van or any other location where utility power is not available. This feature of the present invention allows the testing of meters within a vehicle, protected from inclement weather conditions and generally results in more productive and accurate testing of such metering equipment.

Figure 1:
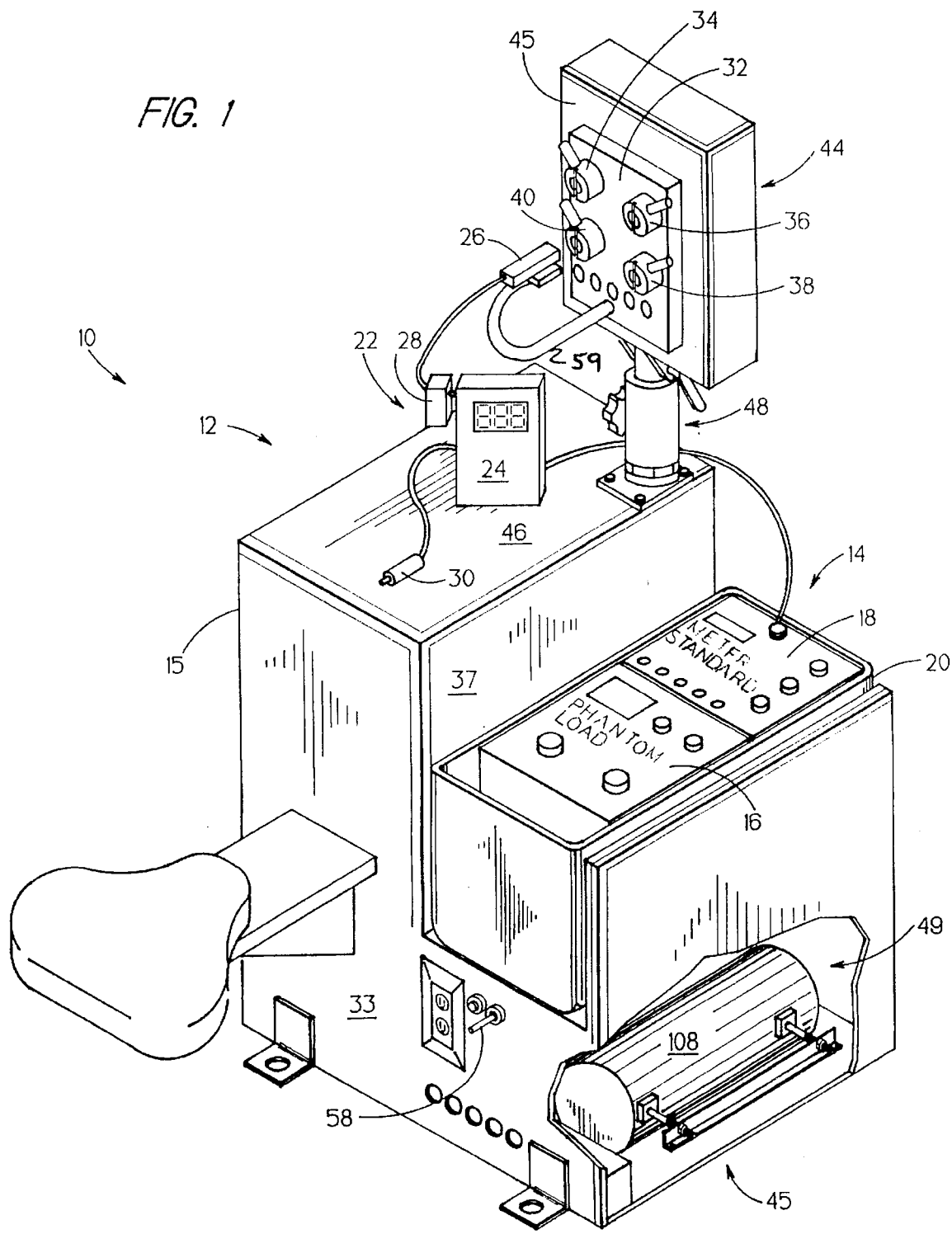
FIG. 1 is a perspective view of the apparatus of the present invention showing the removable instrumentation unit positioned on the stationary fixture.
Figure 2:
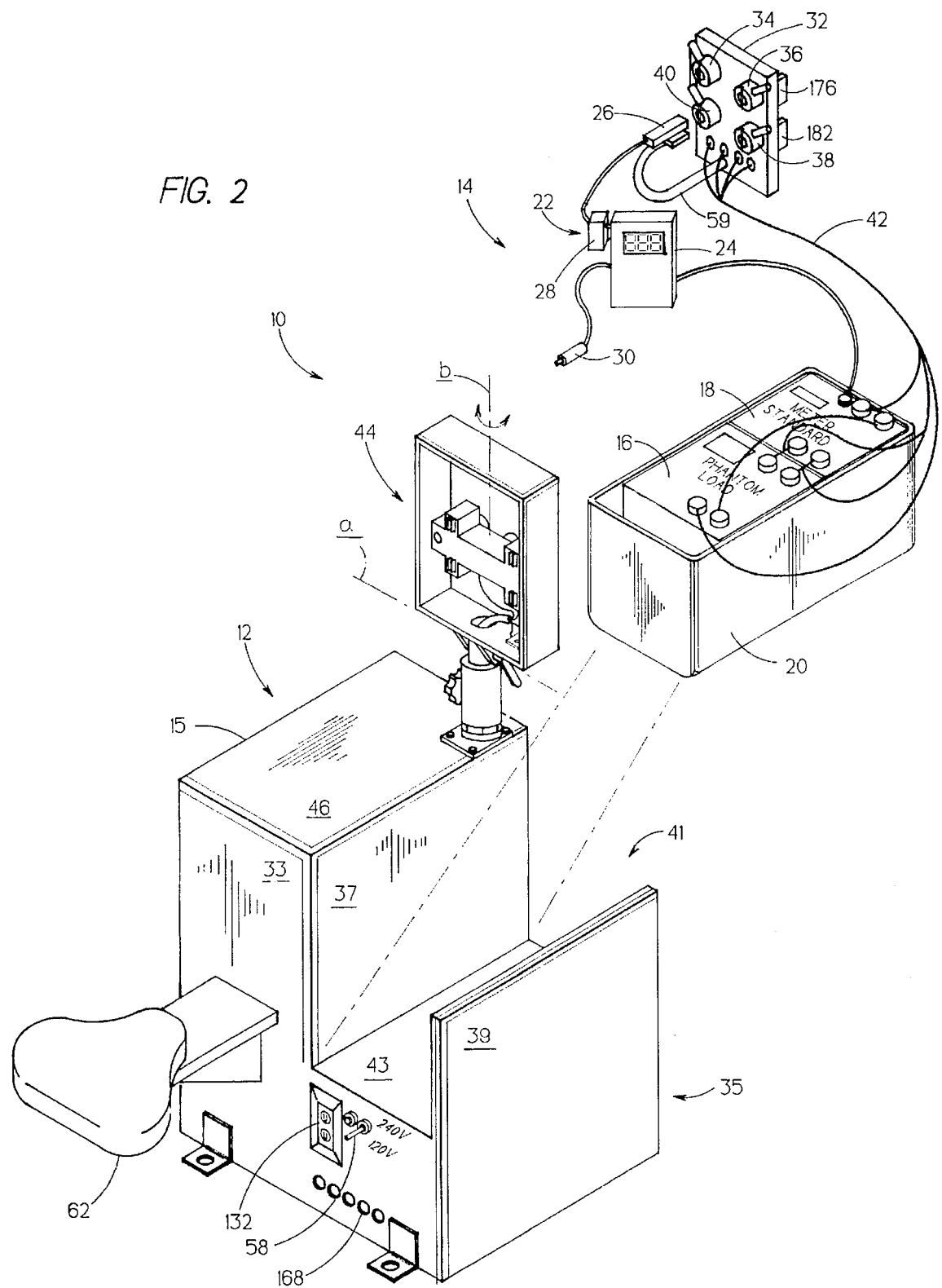
FIG. 2 is a perspective view of the apparatus showing the instrumentation unit removed from the stationary test fixture for on-site testing of the meter.

Referring to FIGS. 1 and 2, the apparatus 10 of the present invention generally comprises a stationary fixture 12 and a removable or portable instrumentation unit 14. In the configuration of FIG. 1, the instrumentation unit 14 may be utilized in conjunction with the stationary fixture 12 to test a watt-hour meter (not shown) within a vehicle such as a van. Alternatively, and as depicted in FIG. 2, the instrumentation unit 14 may be removed from the stationary fixture 12 to test the watt-hour meter directly at the customer's meter box (not shown).

The instrumentation unit 14 generally comprises a phantom load unit 16 and a meter standard unit 18 adapted to be carried in a tray or carrying case 20. The phantom load 16 is a conventional device for supplying a test current which may be selected by the user. The phantom load 16 is available as Catalog No. RC 50 Meter Test Kit from The Eastern Specialty Co. of Philadelphia Pa.

The meter standard 18 in the preferred embodiment is a watt-hour standard that is used to computer the amount of energy an "ideal" meter would record based upon test current applied by the phantom load 16 over a defined test period. The meter standard unit 18 is available as Part No. RM 11 from Radian Research Inc., 661 North 36th Street, Lafayette, Ind. 47905.

The instrumentation unit 14 further comprises a light sensing unit 22 and a counting device 24. The light sensing unit 22 is configured with a photo-eye 26 which is adapted to sense the rotation of the disc within the meter. The analog output from the photo-eye 26 is sent to a meter disk sensor 28 which in turn outputs a digital signal to the counting device 24. The counting device 24 includes a snap switch 30 which when depressed, initiates the test period. The counting device 24 will stop counting when it reaches a number of disc revolutions equal to a predetermined number of disc revolutions selected by the user. The counting device 24 is available as the Radian No. RM-1N Solid State Meter Interface available from Radian Research Inc., 661 North 36th Street, Lafayette, Ind. 47905. The light sensing unit 22 is available as a single unit under Part No. RM-DS from Radian Research Inc.

Alternatively, the light sensing unit 22 and the counting device 24 may be removed from the instrumentation unit 14, and the snap switch 30 may be connected directly to the meter standard unit 18. In this configuration, the test period would be defined by the user by actuating the snap switch 30 upon visually noting the beginning of a disc revolution and then depressing the snap switch 30 at the end of the predetermined number of disc revolutions. This technique, however, is subject to errors in that it may be difficult for some users to accurately view the beginning and end of a disc revolution.

The instrumentation unit 14 further comprises an adaptor board 32 (FIG. 2) having cam type locking jaws 34, 36, 38, and 40 for securely engaging with the blade terminals of the meter to be tested. As will described more fully herein, the adaptor board 32 is also configured with blades 176, 178, 180, and 182 (FIG. 7) which extend from the back surface of the adaptor board 32 and which engage with a meter box 44 (to be described) of the stationary fixture 12 in order to provide a supply voltage for operating the phantom load unit 16 and the meter standard unit 18, and a test voltage which is applied directly to the meter. The adaptor board 32 is further adapted to interconnect with the phantom load unit 16 so that a user may selectively apply a test current to the various components of the meter. As shown, the adaptor board 32 further comprises a flexible support arm 59 having one end mounted to the adaptor board and having at the other end a velcro strip for removably supporting the photo-eye 26. The arm 59 is sufficiently flexible so that the photo-eye 26 may be moved to various orientations where it can be accurately aimed to sense the rotation of the disc.

The stationary fixture 12 generally comprises a bi-level or stepped housing 15 that is formed by a front panel 33, a back panel 35 (FIG. 3), a central or intermediate side panel 37, an upper panel 46, an outer side panel 39, a middle panel 43, and a floor 45, all of which may be assembled by suitable fastener means. The side panel 39 extends a distance above the middle panel 43 and along with the upper portion of the center panel 37, form a holding compartment or cavity 41 to support and retain the carrying case 20 thereon. The center panel 37 divides the housing 15 into an open compartment 47 and a closed compartment 49 which is accessible by removing the middle panel 43.

The stationary fixture 12 further comprises the meter box 44 mounted by a leveling mechanism 48 to the panel 46. The leveling mechanism 48 is adapted so that the meter box 44 can be rotated in the horizontal about axis b and pivoted in the vertical about axis $\underline{a}$ for leveling the disc within the meter. Failure to maintain the disc in the horizontal plane during testing may result in testing errors.

The stationary fixture 12 further comprises a power supply consisting essentially of a battery 106 located in the open compartment 47 which is connected to a generator 108 located in the closed compartment 49. When activated by a switch 58, the power supply is configured to supply an a.c voltage of either 120 or 240 volts to the meter box 44.

Figure 3:
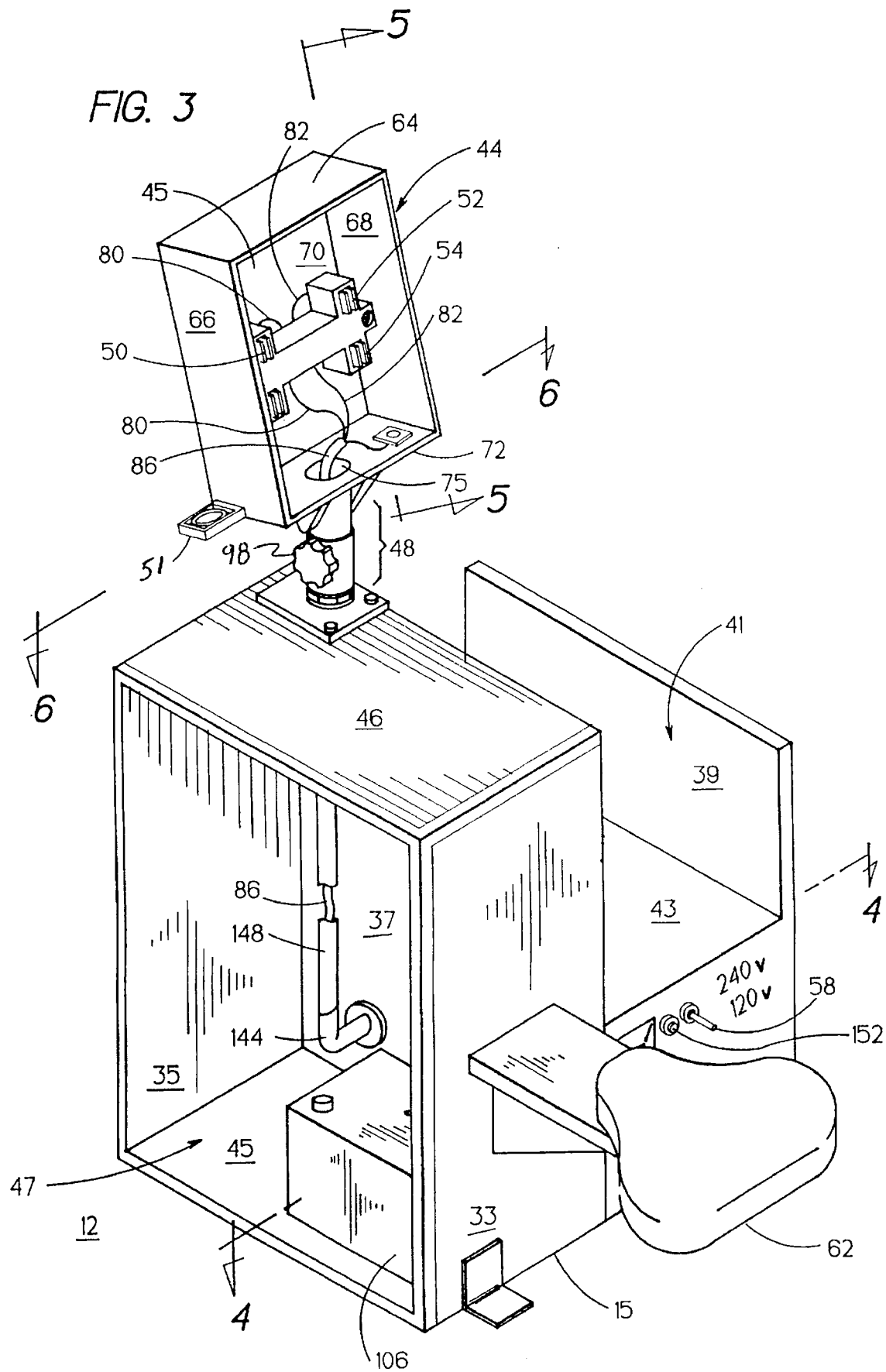
FIG. 3 is another perspective view of the stationary fixture.

As shown in FIG. 3, the meter box 44 is formed by a cover 45, a top panel 64, sides panels 66 and 68, a back panel 70, and a bottom panel 72. The meter box 44 further comprises jaws 50, 52, 54, and 56 which are adapted to engage with the blades 176, 178, 180 and 182 (FIG. 7) of the adaptor board 32. The bottom panel 72 has an opening 75 through which an insulator cover 86 (to be described) may be passed.

Figure 4:
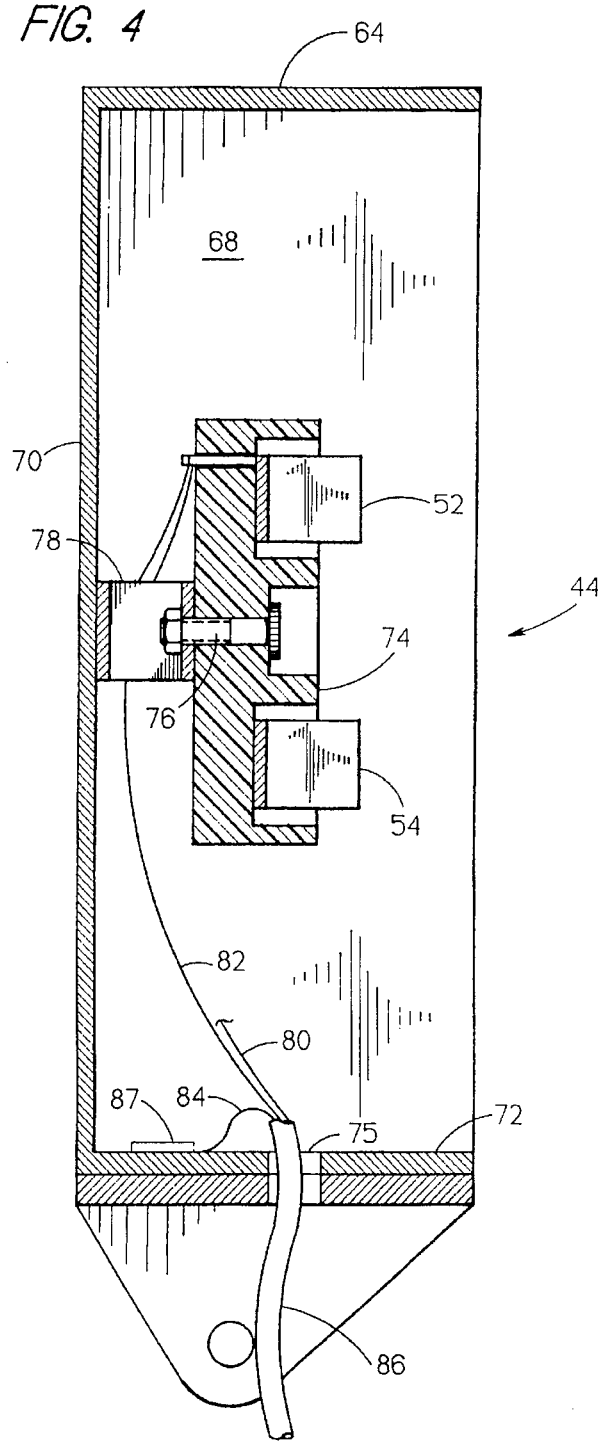
FIG. 4 is a cross-sectional view taken along line 4—4 of FIG. 3 showing the layout and interconnection of the battery, generator, voltage switch, thermal sensor, and transformer.

As best shown by FIGS. 3 and 4, each of the jaws 50, 52, 54 and 56 are mounted to an insulator 74 by suitable fastener means. The insulator 74 is mounted to a metal clip 78 by any suitable fastener means such as a bolt and nut combination 76. The clip 78 is secured to the back panel 70 by any suitable fastener means. The insulator 74 may be a ceramic or any other suitable material which will electrically isolate the jaws from the metal clip 78 and the back panel 70.

Jaws 50 and 52 are electrically connected by wires 80 and 82 to the power source so that either a voltage of 120 or 240 volts will be across the jaws when the voltage switch 58 is activated. A third wire 84 is shown grounded to the bottom panel 72 by a clip 87. The wire 84 serves to connect the power source and the stationary fixture 12 to a common ground. For protection against chaffing and ease of installation, the wires 80, 82, and 84 are generally enclosed by an insulator cover or shield 86 which is passed through opening 75 to the leveling mechanism 48.

Figure 5:
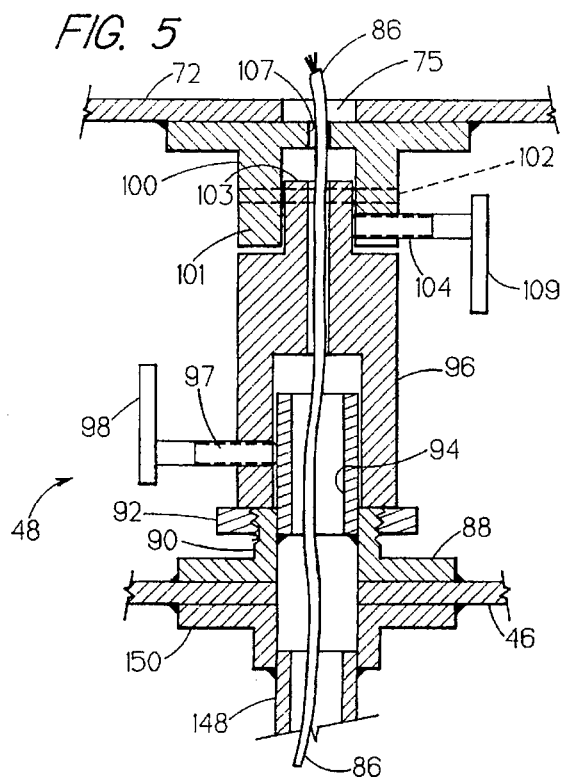
FIG. 5 is a cross-sectional view taken along line 5—5 of FIG. 3 showing the internal construction of the meter box.

Referring to FIG. 5, the leveling mechanism 48 is shown with the insulator cover 86 freely extending axially therethrough and into the meter box 44 where the wires 80, 82, and 84 are connected as heretofore described. The leveling mechanism 48 generally comprises a lower support or mounting member 88 which has a bore portion affixed to the upper panel 46 by any suitable fastening means. The mounting member 88 also includes an externally threaded cylinder portion 90 which is adapted to receive a nut 92. The cylinder 90 also includes internal threads (not shown) which engage with corresponding external threads (not shown) of an extension tube or rod 94. The extension tube 94 provides a cylindrical surface centered on a vertical axis b about which a coupler 96 may be rotated, while the upper surface of the nut 92 provides a bearing surface for the rotation of the coupler 96. The coupler 96 may be secured in a position relative to the extension tube 94 by engaging a set screw 97 which may be rotated by a knob 98.

The leveling mechanism 48 further comprises a pivotable coupler 100 which allows the meter box 44 to be pivoted vertically about a horizontal pivot pin 102. The coupler 100 includes a plate portion having an opening 107 which may be affixed and aligned with opening 75 of the bottom panel 72 by any suitable fastening means. The coupler 100 also includes laterally spaced leg portions 101 adapted to be disposed on opposite sides of a boss or protrusion 103 that extends a upwardly from the coupler 96. The legs 101 and boss 103 are provided with horizontal bores which are aligned to receive the pivot pin 102, whereby the meter box may be pivoted about a horizontal axis a. The coupler 100 may be secured in any position relative to the coupler 96 by rotating a set screw 104 by a handle or knob 109.

Referring back to FIG. 3, a level display 51 is provided on the bottom panel 72 of the meter box 44 and may be used in conjunction with the leveling mechanism 48 to indicate when the meter box 44 is level. In one embodiment, the level display 51 is a 360 degree bubble level.

Figure 6:
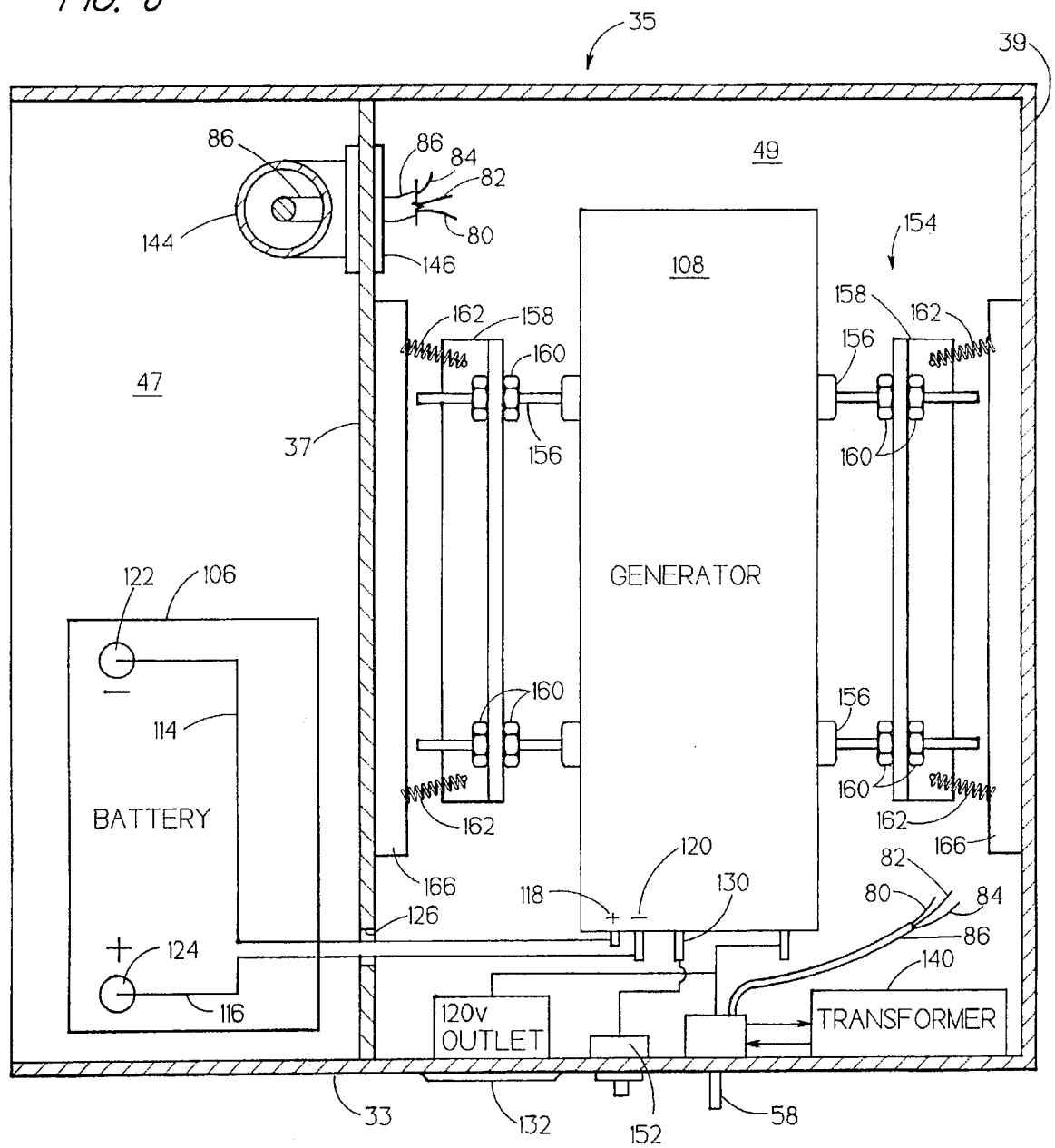
FIG. 6 is a cross-sectional view taken along line 6—6 of FIG. 3 showing the construction of the leveling mechanism.

Referring now to FIG. 6, where the battery 106 is shown located in the open compartment 47 and the generator 108 is shown located in the closed compartment 49. The battery 106 is a conventional 12 volt battery. The generator 108 is adapted to generate a 120 volt a.c. voltage in response to the 12 volt d.c. supplied by the battery 106. Cables 114 and 116 are provided to connect the positive terminal 122 and negative terminal 124 of battery 106 to the positive and negative terminals 118 and 120 of the generator 108, respectively, through an opening 126 provided in center panel 37. Although not shown, the battery 106 may be connected to the alternator of a vehicle's engine so that the battery will be re-charged each time the engine is operated.

Generator 108 includes an output 136 which is connected to an 120 volt outlet 132 mounted on the front panel 33. The generator 108 is available as Part No. DA12A500 from Pacific Scientific, 4301 Kiskwaukee Street, Rockford, Ill. When purchased from the manufacturer, the outlet 132 is mounted directly on the generator 108. For use in this embodiment of the invention, the outlet 132 has been removed from the generator housing and mounted on the front panel 33.

The output 136 is also connected to the switch 58 which in turn is connected to a step-up transformer 140. When switch 58 is placed in the 120 volt position, the output from the generator is connected directly to the meter box 44 by wires 80, 82, and 84. As heretofore described, wire 80 is the "hot" line, wire 82 is the return line, and 84 is ground. When the switch 58 is placed in the 240 volt position, the output of the generator 108 is passed to the transformer 140 where the voltage is stepped-up to 240 volts. The output of transformer 140 is then fed back through the switch 58 and output along wires 80, 82 and 84 to the meter box 44.

As further shown, the cable cover 86 encasing wires 80, 82, and 84 is passed from the closed compartment 49 to the open compartment 47 through an elbow fitting 144 secured to center panel 37 by a nut 146. As best shown by FIGS. 3 and 5, the elbow fitting 144 is connected to one end of a vertical extension tube or pipe 148. The other end of pipe 148 includes is mounted by suitable means to a flange or support member 150 which is in turn affixed to the to the upper panel 46.

As a safety measure, the operation of the generator 108 is limited by a thermal breaker 152 (FIGS. 3 and 6) connected to the generator at terminal 130. The thermal breaker 152 will "open" if the temperature of the internal components of the generator exceed the manufacturers temperature rating. When the thermal breaker 152 "opens," the generator 108 will not operate.

The generator 108 is disposed within the second compartment 49 where it is supported by a vibration dampening mechanism 154 to thereby dampen any vibration that may be induced into the housing 15 by virtue of the operation of the generator 108. The inventor has found that the rotating disc of a watt-hour meter is very sensitive to vibration and that even small amounts of vibration will cause the disc to spin abnormally thereby creating testing errors.

In the embodiment shown, dampening mechanism 154 may comprise bolts 156 which are adapted to hold the generator 108 in compression. The bolts 156 are adjustably attached to flanges 158 by nuts 160. Flanges 158 are in turn secured by coil or spring members 162 to flanges 166 which are attached by screws (not shown) to the central panel 37 and the side panel 39. The compressive force exerted upon the generator 108 can be increased or decreased by adjusting the nuts 160.

Referring back to FIG. 2, the stationary fixture 12 also comprises a plurality of vent holes 168 positioned on the front panel 33 which are adapted to provide air circulation through the closed compartment 49 to thereby cool the generator 108.

As also shown, the stationary fixture 12 further comprises a seat 62 mounted to the front panel 33. The seat 62 is provided so that the user may sit while performing the testing process.

Figure 7:
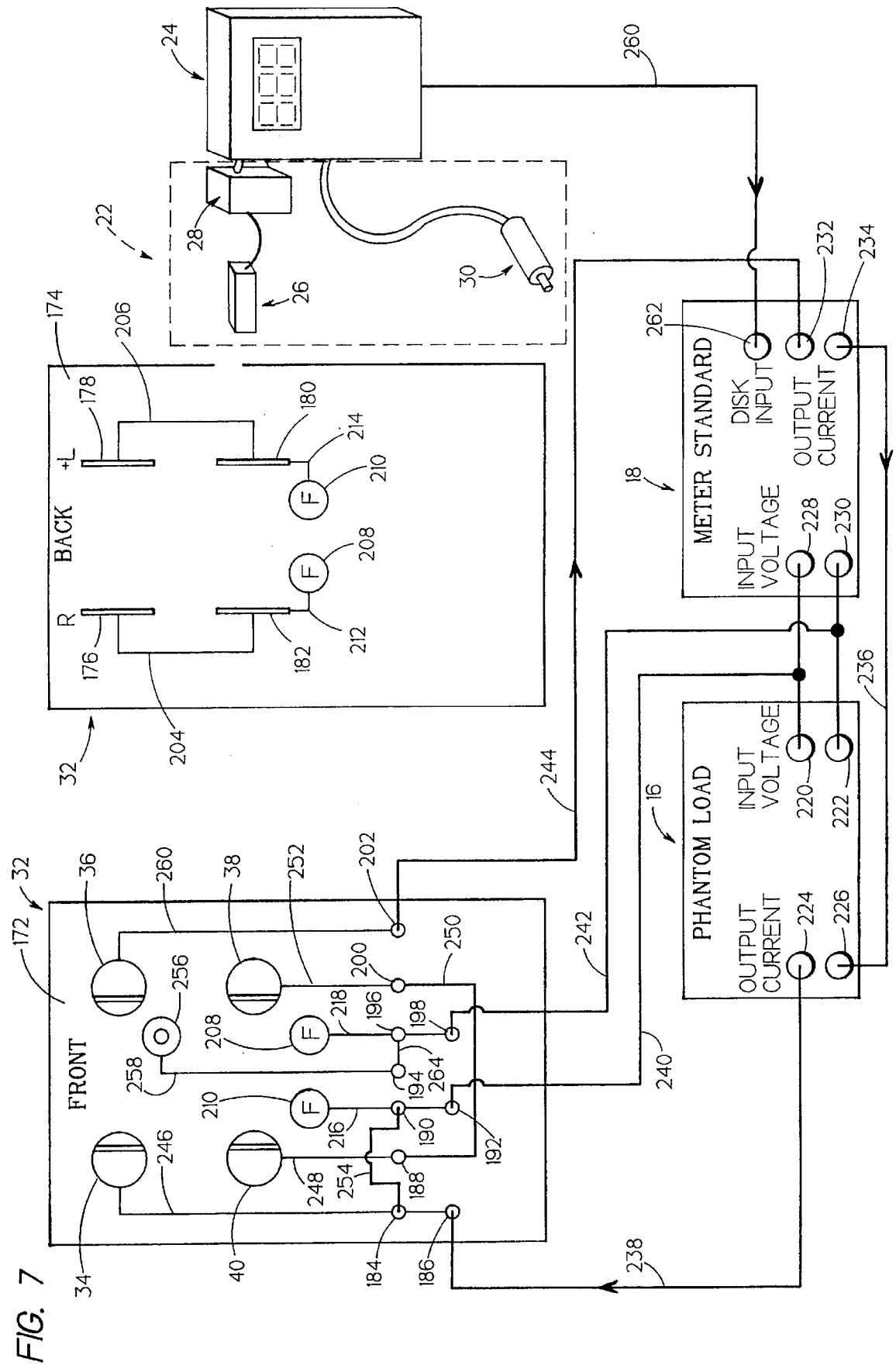
FIG. 7 is a plan view of the adaptor board and a wiring diagram showing the interconnection of the adaptor board, the phantom load unit, the meter standard unit, the light sensing unit, and the counting device.

Referring to FIG. 7, where a more detailed illustration of the instrumentation unit 14 is shown. The instrumentation unit 14 generally comprises the adaptor board 32, the phantom load 16, the meter standard 18, the light sensing unit 22, and the counting device 24.

The adaptor board 32 is formed with a front face 172 and a back face 174. Positioned on the front face 172 and as heretofore described, are cam locking jaws 34, 36, 38, and 40 which are adapted to engage with the blade terminals of the meter to be tested. Located on the back side 174 of adaptor board 32 are blade terminals 176, 178, 180, and 182 which are adapted to engage with jaws 34, 26, 38 and 40 of meter box 44, respectively. The adaptor board 32 further comprises female interconnect terminals or receptacles 184, 186, 188, 190, 192, 194, 196, 198, 200, and 202 which are adapted to receive corresponding male terminals of one or more jumper cables (to be described).

The adaptor board 32 is constructed so that blade terminals 176 and 182, and 178 and 180 are electrically connected together through conductors or traces 204 and 206. The adaptor board 32 further comprises a fuse 208 having one side connected by a conductor 212 to blade terminal 182. The other side of fuse 208 is connected by a conductor 218 to terminals 196 and 198. The adaptor board 32 comprises a second fuse 210 having one side connected by a conductor 214 to blade terminal 180. The other side of fuse 210 is connected by a conductor 216 to terminals 190 and 192. In that blade terminals 178 and 176 would be connected to jaws 50 and 52 of meter socket box 44 (FIG. 3), respectively, a voltage potential of either 120 or 240 volts will be across blade terminals 178 and 176, and therefore, across blade terminals 180 and 182, and across terminals 190, 192 and 196, 198. Adaptor board 32 is further formed such that cam locking jaw 34 is connected by a conductor 246 to terminal 184, while cam locking jaw 40 is connected by a conductor 248 to terminal 188. Similarly, cam locking jaw 36 is connected by a conductor 260 to terminal 202 while cam locking jaw 38 is connected by a conductor 252 to terminal 200.

The adaptor board further comprises a potential terminal 256 connected by a conductor 258 to terminal 194 which is connected by a conductor 264 to terminal 196. The potential terminal 256 is positioned such that it will engage with the potential terminals of the meter when the meter is engaged with the jaws 34, 36, 38, and 40.

As heretofore described, a 7.2 watt-hour meter (not shown) includes a line current coil A, a line coil B, and a potential coil. When testing these three parts together, the adaptor board 32, phantom load 16, and meter standard 18 would be connected as follows. Terminal 192 (a.c. hot) is connected by a jumper wire 240 to the both an input voltage terminal 220 of the phantom load 16 and an input voltage terminal 228 of the meter standard 18. Terminal 198 (return) is connected by a jumper wire 242 to both an input voltage terminal 222 of phantom load 16 and an input voltage terminal 230 of meter standard 18. Accordingly, the phantom load module 16 and the meter standard 18 are connected in parallel and each are powered by a voltage of either 120 or 240 volts present at terminals 192 and 198 of adaptor board 32. A jumper wire 254 is used to connect terminal 184 to terminal 190. Similarly, a jumper wire 250 is used to connect terminal 188 to terminal 200. Further, the counting device 24 is connected by jumper wire 260 to the disk input terminal 262 of meter standard.

With the above configuration and with the terminal blades of a watt-hour meter to be tested connected into the jaws 34, 36, 38, and 40 of the adaptor board 32, the test current path loop would be as follows. Beginning at output current terminal 224 of phantom load 16, the test current would flow along conductor 238 to terminal 186, along conductor 246 to jaw 34, into line coil A of the watt-hour meter (not shown), out to jaw 40 and along conductor 248 to terminal 188, by jumper cable 250 to terminal 200, along conductor 252 to jaw 38, into line coil B of the watt-hour meter (not shown) and out to jaw 36, along conductor 260 to terminal 202, along jumper wire 244 to terminal 232 of the meter standard 18, through internal test current sensing circuitry (not shown) within the meter standard 18 to current terminal 234, and along jumper wire 236 to current terminal 226 of the phantom load 16 where the test current loop is completed. The above configuration applies the test current to both line coil A and B of the watt-hour meter. The jumper 254 from terminal 190 to terminal 184 provides the a test voltage at jaw 34. This connection is necessary in that the phantom load 16 applies only a "test current" and not a test voltage. Additionally, the connection of terminal 196 to terminal 194 by jumper cable 264 provides a voltage return at the potential terminal 256 so that a voltage potential will exist across the potential coil (by industry standards, line Coil A of a watt-hour meter is connected across a potential coil to a potential terminal).

When testing a meter on the stationary fixture, the adaptor board 32 would be connected to the jaws 50, 52, 54 and 56 of the meter box 44. The user would then connect the watt-hour meter to cam locking jaws 34, 36, 38 and 40 of adaptor board 32. At that point, if necessary, the user would level the meter box 44 using the leveling mechanism 48 and the level display device 47. The user would then attach the photo-eye 26 to the arm member 59 and adjust the same so that the photo-eye will properly sense the rotation of disc. Then, the user would determine which part(s) of the watt-hour meter (i.e., line coil A, line coil B, and/or the potential coil) are to be tested and connect the output current of the phantom load 16 to the adaptor board 32 accordingly. At this point, the user would select the desired test voltage by placing the switch 58 in either the 120 or 240 volt position. The user may then enter the duration of the test period by setting the counting device 24 to number of desired disc revolutions. The user may then select the desired test current using phantom load 16. The remaining step is to initiate the test by depressing snap switch 30.

After the counting device has counted a number of disc revolutions equal to the number of revolutions selected by the user, the meter standard 18 will display the amount of energy usage in "watt-hours" that an ideal meter would use during the test period. For example, if a 7.2 watt-hour meter is being tested, each disk revolution should ideally indicate 7.2 watt-hours of energy usage. If a test period of 10 revolutions is selected by the user, the meter standard should ideally display a result of 72 watt-hours. If the result is higher, then the meter is slow. If the result is lower, then the meter is considered fast. In either situation, the watt-hour meter would be recalibrated in the customary manner and the above test sequence would be repeated until the meter standard displays a correct or acceptable energy usage for the meter.

As will be apparent to those skilled in the art, the test apparatus of the present invention offers many advantages heretofore unavailable in conventional meter testing apparatus. One advantage is that the standard fixture 12 includes its own self contained a power supply in the form of a battery and generator thereby making the use of the apparatus not dependent upon the presence of utility power. Accordingly, the apparatus may be used by a technician to test a meter in the comfort of a vehicle and unexposed to outside weather conditions. Another advantage is that the user may remove the instrumentation unit 14 and test the meter directly at the customer's meter box. Still further, the meter box 44 is mounted to the housing 15 by a leveling mechanism 48 which in conjunction with the leveling display 47, provides the user with the ability to level the meter box 44. Still another advantage of the present invention is that the generator is mounted to the housing by a dampening mechanism which isolates any vibration from the housing and meter box.

Although the present invention has been described with reference to the preferred embodiment, it will readily apparent to those skilled in the art that the test apparatus may be used and/or modified without departing from the spirit and scope of the invention. By way of example only, the present invention may be used and/or readily adapted for use with metering devices other than a watt-hour meter. Further, the various components of the present invention may take a variety of forms any of which would perform substantially the same function and in the same way. By way of example only, the leveling mechanism may be designed in any of a number ways so that the meter box may be leveled or partially leveled. Further, the generator may be damped by a variety of dampening mechanism, including but not limited to the use of polymers.

We claim:

1. An apparatus for mounting within a vehicle to test an utility meter, the meter having a rotating disc, the apparatus comprising:

a fixture disposed in the vehicle, said fixture having an interface member mounted to a surface of said fixture and a self-contained power supply configured to supply a.c. power to said interface member, said fixture further comprises a leveling member for movably mounting said interface member to said surface; and a test unit comprising an adaptor member adapted to be removably connected to said interface member and to the meter, first means connected to said adaptor member for applying a test current to the meter through said adaptor member; second means for generating a signal indicative of the beginning and end of a revolution of the rotating disc; and third means connected to said adaptor member and to said second means for computing a result indicative of the accuracy of the meter in response to said test current applied to the meter by said first means and said signal generated by said second means.

2. The apparatus of claim 1, wherein said leveling member is adapted so that said interface member is pivotal with respect to said surface by said leveling member.

3. The apparatus of claim 2, wherein said leveling member is adapted so that said interface member is rotatable with respect to said surface by said leveling member.

4. The apparatus of claim 3, wherein said fixture further comprises a level display adapted so to display when said interface member is level.

5. The apparatus of claim 4, wherein said level display is a bubble level.

6. The apparatus of claim 5, wherein said first means comprises a phantom load unit.

7. The apparatus of claim 6, wherein said third means comprises a meter standard unit.

8. The apparatus of claim 7, wherein said second means comprises a light sensing unit.

9. The apparatus of claim 8, wherein said second means further comprises a counting device connected to said light sensing unit and said meter standard unit.

10. The apparatus of claim 9, wherein said second means further comprises a snap switch connected to said third means which may be activated by the user.

11. An apparatus for mounting within a vehicle to test an utility meter, the meter having a rotating disc, the apparatus comprising:

a fixture disposed in the vehicle, said fixture having an interface member mounted to a surface of said fixture and a self-contained power supply configured to supply a.c. power to said interface member, said power supply comprises a battery and a generator connected to said battery to supply an a.c. voltage, said power supply further comprising a transformer configured to step-up said voltage output by said generator, said generator being mounted to said fixture by a dampening mechanism adapted to isolate said interface member from any vibrations generated by the operation of said generator; and a test unit comprising an adaptor member adapted to be removably connected to said interface member and to the meter, first means connected to said adaptor member for applying a test current to the meter through said adaptor member; second means for generating a signal indicative of the beginning and end of a revolution of the rotating disc; and third means connected to said adaptor member and to said second means for computing a result indicative of the accuracy of the meter in response to said test current applied to the meter by said first means and said signal generated by said second means.

12. The apparatus of claim 11, wherein said dampening mechanism comprises a plurality of coil springs.

13. The apparatus of claim 12, wherein said first means comprises a phantom load unit.

14. The apparatus of claim 13, wherein said third means comprises a meter standard unit.

15. The apparatus of claim 14, wherein said second means comprises a light sensing unit.

16. The apparatus of claim 15, wherein said second means further comprises a counting device connected to said light sensing unit and said meter standard unit.

17. The apparatus of claim 16, wherein said second means further comprises a snap switch connected to said third means which may be activated by the user.

18. The apparatus of claim 17, wherein said fixture further comprises a leveling member for movably mounting said interface member to said surface.

19. The apparatus of claim 18, wherein said leveling member is adapted so that said interface member is pivotal with respect to said surface by said leveling member.

20. The apparatus of claim 19, wherein said leveling member is adapted so that said interface member is rotatable with respect to said surface by said leveling member.

* * * * *